United States Patent [19]

Taylor

[11] 4,311,532
[45] Jan. 19, 1982

[54] METHOD OF MAKING JUNCTION ISOLATED BIPOLAR DEVICE IN UNISOLATED IGFET IC

[75] Inventor: David L. Taylor, Carrollton, Tex.

[73] Assignee: Harris Corporation, Melbourne, Fla.

[21] Appl. No.: 61,775

[22] Filed: Jul. 27, 1979

[51] Int. Cl.³ .............. H01L 21/263; H01L 21/02; H01L 21/20; H01L 29/72

[52] U.S. Cl. .................... 148/1.5; 148/186; 148/187; 357/43; 357/91

[58] Field of Search .......... 148/1.5, 187, 186; 357/43, 91

[56] References Cited

U.S. PATENT DOCUMENTS

| | | | |
|---|---|---|---|
| 3,576,475 | 4/1971 | Kronlage | 317/235 |
| 3,581,165 | 5/1971 | Seelbach | 317/235 |
| 3,595,715 | 7/1971 | Thire et al. | 148/175 |
| 3,609,479 | 11/1971 | Lin | 317/235 |
| 3,636,372 | 1/1972 | Hujita et al. | 307/251 |
| 3,865,649 | 2/1975 | Beasom | 148/187 |
| 4,027,324 | 5/1977 | Yagi et al. | 357/34 |
| 4,120,707 | 10/1978 | Beasom | 148/186 |
| 4,122,481 | 10/1978 | Horie | 357/23 |

Primary Examiner—Upendra Roy
Attorney, Agent, or Firm—Leitner, Palan, Martin & Bernstein

[57] ABSTRACT

A bipolar device is formed in an N epitaxial layer region isolated from an N substrate and the remainder of the N epitaxial layer by a P surface ring and a buried P region. An N channel device is formed in the P surface ring and a P channel device is formed in the N epitaxial layer. A buried N region is formed in the buried P region using the same mask used to form the buried P region.

10 Claims, 9 Drawing Figures

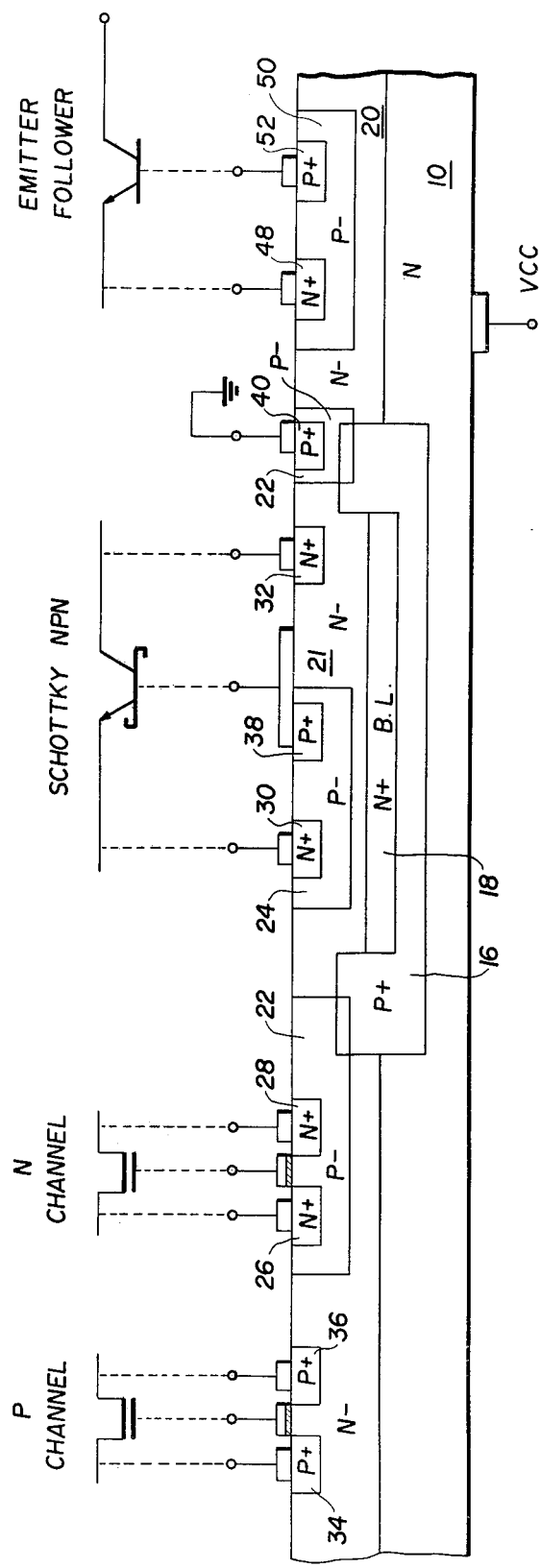

METHOD OF MAKING JUNCTION ISOLATED BIPOLAR DEVICE IN UNISOLATED IGFET IC

BACKGROUND OF THE INVENTION

1. Field of the Invention

The present invention relates generally to integrated circuits having IGFET and bipolar devices and more specifically to an IC having junctional isolated bipolar devices in an unisolated IGFET IC.

2. DESCRIPTION OF THE PRIOR ART

In an effort to increase speed and current capacity, while reducing power dissipation, integrated circuits are being designed incorporating insulated gate field effect transistors (IGFET) and bipolar devices. Early processes generally formed junction field effect transistors and bipolar transistors in junction isolated regions as described in U.S. Pat. Nos. 3,576,475 and 3,595,715. Because the circuit used junction field effect transistors, the field effect transistors and bipolar transistors had to be formed in junction isolated islands. This increased the space required to form the circuits. In an effort to reduce the space required, as well as to provide a process for compatibly forming IGFETs and bipolar transistors, U.S. Pat. No. 3,865,649 formed the devices in dielectrically isolated regions. This patent requires a specific sequence of preparing the material in the dielectrically isolated regions to provide device characteristics required. This processing is considered complicated and expensive and does not take advantage of the self-isolating characteristic of IGFET devices. The use of the self-isolating characteristic of IGFETs in combination with the self-isolating characteristic of emitter followers are illustrated in U.S. Pat. Nos. 3,609,479 and 3,636,372. The circuits of these two patents are limited to specific environments and configurations since no isolated regions are provided for other devices. Thus, although taking advantage of the self-isolating characteristic of IGFETs to minimize space, it does not also provide in the structure junction isolation for a single bipolar device.

Thus, there exists a need for a process of fabricating an integrated circuit which bridges the gap between the totally isolated and the totally unisolated integrated circuits having IGFET and bipolar transistors.

SUMMARY OF THE INVENTION

The present invention provides a process of fabricating an integrated circuit having a self-isolating IGFET and an isolated bipolar device therein. The process begins with the diffusion of P type impurities into an N type substrate followed by diffusion of N+ impurities, using the same mask, into the P type region. An N epitaxial layer is then grown over the substrate. P type regions including a P type ring and other P type areas are formed in the surface of the epitaxial layer and all the impurities are diffused until the buried P type region intersects or overlaps the P type ring in the epitaxial layer to form an isolated region of the epitaxial layer. N+ type impurities are then introduced into the isolation ring to form the source and drain of N channel IGFET as well as regions of bipolar devices in the isolated epitaxial region. P+ type impurities are then introduced into the epitaxial layer to form the source and drains of P channel devices and regions of bipolar devices in the isolated epitaxial layer. The resulting structure has a junction isolated bipolar device formed in the epitaxial layer, an N channel device formed in the isolation ring and a P channel device formed in the epitaxial layer. The bipolar device formed in the isolated region may include NPN transistors, lateral PNP and vertical PNP transistors as well as various diode configurations. Other bipolar devices not requiring isolation, for example emitter followers, may also be formed in the epitaxial layer without isolation.

OBJECTS OF THE INVENTION

An object of the present invention is to provide an isolated region of an integrated circuit into which bipolar devices may be formed using the processing steps of a standard complementary insulated gate field effect transistor process.

Another object is to provide a method of fabricating an integrated circuit having isolated bipolar devices and unisolated complementary insulated gate field effect transistors.

A further object of the invention is to provide a method of fabricating an integrated circuit which minimizes the number of steps and results in an integrated circuit having minimum surface space.

Other objects, advantages and novel features of the present invention will become apparent from the following detailed description of the invention when considered in conjunction with the accompanying drawings.

BRIEF DESCRIPTION OF THE DRAWINGS

FIG. 8 is a cross-sectional view of a modification of the integrated circuit of FIG. 6 incorporating the principles of the present invention.

DESCRIPTION OF THE PREFERRED EMBODIMENTS

Figure 1:
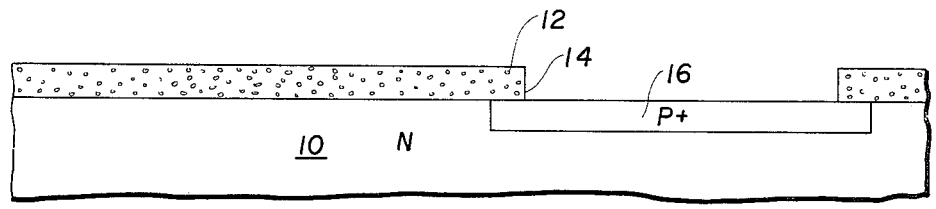
FIGS. 1-6 are cross-sectional views of a wafer illustrating a process of fabrication incorporating the principles of the present invention.
Figure 2:
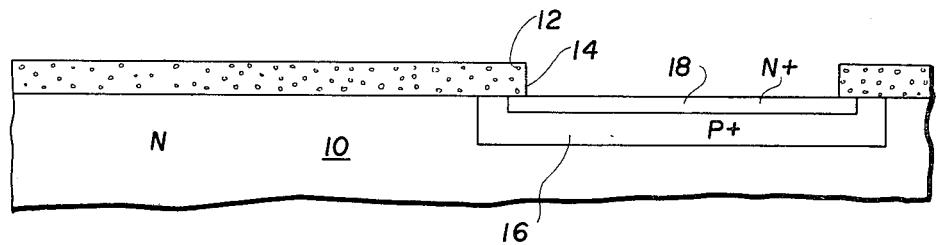

FIG. 1, which illustrates a preferred embodiment of the process of fabrication of the subject invention, shows an N type substrate 10 having a bulk resistivity of approximately 10 ohm centimeters having a masking layer 12 thereon. The masking layer 12 which may be oxide is delineated by using a photoresist material, developing the same and etching to form an aperture or opening 14 therein to define the buried region of the to be formed isolated area. P type impurities, for example, boron are introduced into the surface of the substrate 10 and diffused. This results in a highly doped or P+ type region having an initial impurity concentration of approximately $10^{18}$ carriers per cubic centimeter. Depending upon the bipolar device to be subsequently formed in the isolated region, it may be preferable to form a buried N+ or heavily doped N type region in P+ type region 16. To form this region, the wafer is then subjected to a wash or etching to remove any oxide which has formed in aperture 14 during the diffusion process of the P+ impurities, N+ impurities for example, antimony are then diffused through opening 14 of mask 12, which is the same mask opening as that used for P+ region 16. This results in an N+ region 18 self-aligned with the previously formed P+ region 16. This structure is illustrated in FIG. 2. The initial concentration of the N+ region is generally approximately $10^{19}$ carriers per cubic centimeter.

Figure 3:
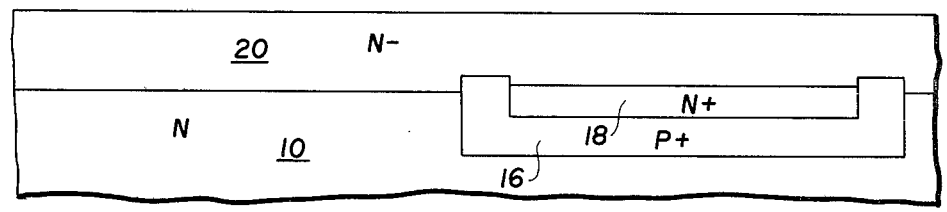

After the N+ diffusion forming N+ region 18, all the oxide is removed from the surface of the wafer 10 and an N− or low impurity concentration epitaxial layer 20 is grown in the substrate 10. The impurity concentration of the N− region is generally approximately $10^{16}$ carriers per cubic centimeter. During the epitaxial process, the P+ region 16 and N+ region 18 diffuse upward into the epitaxial region 20 as well as further downward into the substrate region 10. Some lateral diffusion also occurs but the effect is insignificant for the purpose of the present discussion. The resulting structure is also illustrated in FIG. 3.

Figure 4:
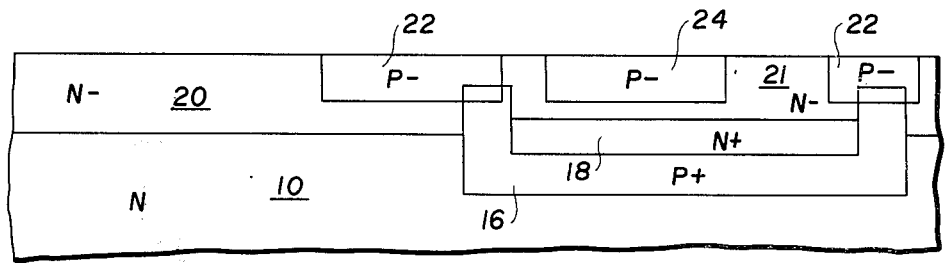
Figure 5:
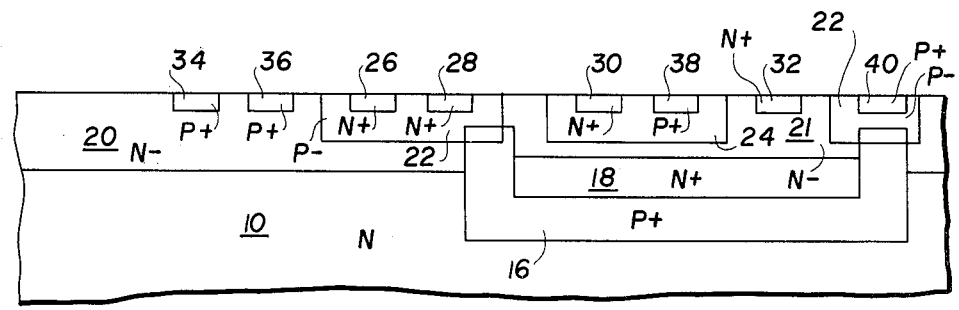

Next, the surface of the epitaxial layer 20 is masked using well known techniques, for example, forming a masking layer and delineation using photoresist techniques. The mask provides apertures for a lateral ring at the edges of the P+ type buried region 16 as well as other P type areas for bipolar devices of the circuit. The newly introduced P type impurities which may be, for example, boron are diffused down into the epitaxial layer 20 while the buried P+ type impurity region 16 and N+ type impurity region 18 are diffused up further into the epitaxial layer 20. The diffusion is continued, depending upon the thickness of the epitaxial layer 20, until the surface P type regions intersect and overlap with the updiffusing P type buried region. This results in the structure in FIG. 4 wherein the ring 22 intersects the edges of the buried P+ region 16. A second P− region 24 is shown formed above the buried N type region 18 in a region 21 of the epitaxial layer 20 which is isolated from the remainder of the epitaxial layer by the buried region 16 and the vertical surface ring 22.

As will be evident from the hereafter described steps, the ring 22 is not merely a separate isolation diffusion, but is also the bodies of subsequently to be formed N channel IGFET devices as well as an active region of bipolar devices to be formed in the isolated epitaxial layer portion 21.

Using well known masking techniques, N+ regions 26 and 28 are formed in P− ring 22 to form the source and drain of an N channel IGFET device. Simultaneously, an N+ region 30 is formed in the P− region 24 and an N+ region 32 is formed in the isolated epitaxial layer 21. The N+ region 30 is an emitter of an NPN transistor and the N+ region 32 is the collector contact region of the same NPN bipolar transistor. Through an appropriately formed mask P+ impurities are then introduced into the N epitaxial layer to form P+ regions 34 and 36 which are the source and drain of a P channel MOS device. Simultaneously therewith, P+ region 38 is formed in the P− region 24 as the base contact region of the NPN transistor. Also, the P+ region 40 is formed in a part of ring 22 as a contact region to the buried isolation P+ region 16 as well as the body of the N channel IGFET device.

Figure 6:
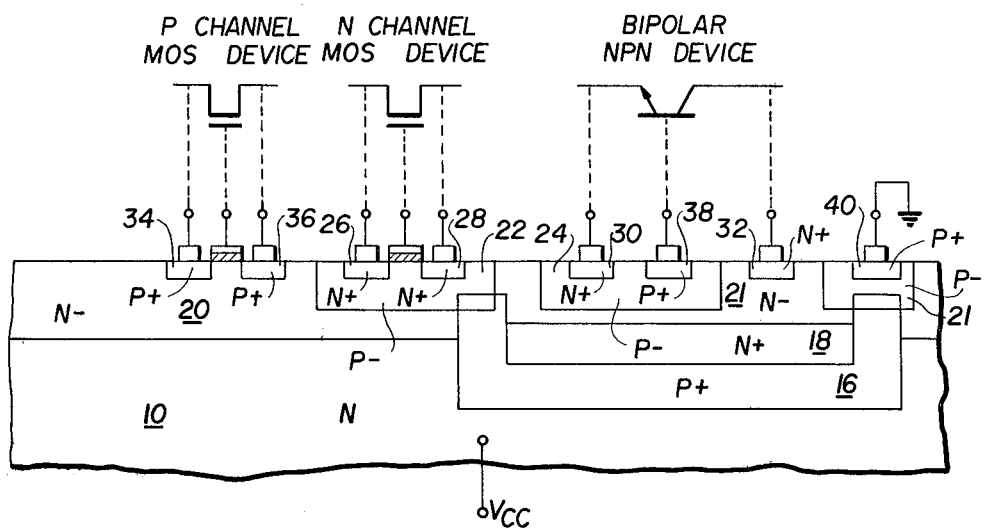

The fabrication process is then continued using well known techniques to form the isolated gate region as well as insulation over the substrate with contact apertures and conductors formed thereon. The resulting structure is illustrated in FIG. 6 as having P and N channel MOS devices and a bipolar NPN transistor formed in an isolated region. Typical biasing is illustrated wherein $V_{CC}$ is connected to the N substrate material 10 and consequently to the body of the P channel IGFET device; ground is connected to the isolation region and the body of the N channel IGFET device. Thus, the integrated circuit includes complementary insulated gate field effect transistors in an unisolated substrate and a bipolar device in an isolated portion of the substrate using common processing steps.

Figure 7:
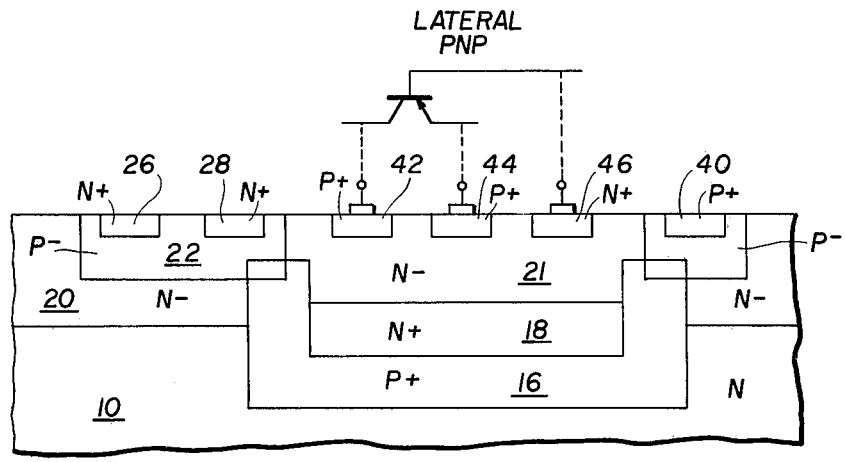
FIG. 7 is a cross-sectional view of a lateral PNP transistor incorporating the principles of the present invention.

Although a bipolar NPN transistor device has been shown formed in the isolated region 21, other bipolar devices may be formed therein. These devices may include Schottky diodes, N+/P+ diodes, N+/P− diodes, as well as lateral PNP transistors. FIG. 7 specifically illustrates the lateral PNP transistor wherein P+ regions 42 and 44, forming collector and emitter, respectively, are formed in the isolated region 21 which forms the base. An N+ base contact region 46 is formed within the N− region 21.

FIG. 8 illustrates even another modification of the IC of FIG. 6. In FIG. 8, the NPN bipolar transistor is shown as having the base contact bridging the P+ base contact 38, the base region 24 and the N− collector region 21. The metal for the base contact is selected such as to form a Schottky barrier with the N− collector region 21. Also shown in FIG. 8 is an emitter follower including an N+ emitter region 48 formed in a P− base region 50 having a P+ base contact 52. The epitaxial layer 20 and the substrate 10 form the collector region. It should be noted that the emitter follower is unisolated compared to the NPN Schottky transistor formed in the isolated region 21.

Figure 9:
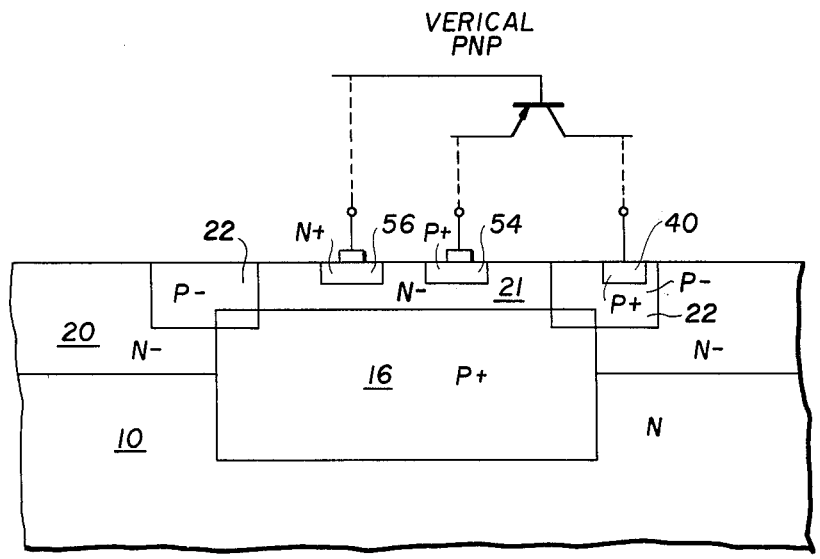
FIG. 9 is a cross-sectional view of a vertical PNP transistor incorporating the principles of the present invention.

Vertical PNP transistors may also be formed in the isolated region 21 by deleting the buried N+ layer 18 as illustrated in FIG. 9. A P+ emitter region would be formed in the N+ isolated region 21 and an N+ base contact region 56 would also be formed in the N− isolated region 21. The N− region 21 would form the base region and the buried P+ region 16 would form the collector region. The vertical PNP transistor of FIG. 9 has substantially higher performance than the lateral PNP device of FIG. 7. This is due to the achievable base width which is defined in a lateral PNP transistor by the collector to emitter spacing of the P+ regions 42 and 44 whereas for the vertical PNP transistor of FIG. 9, the base width is a function of the separation of the P+ surface region 54 and the P+ buried region 16. Typical achievable betas for lateral PNP transistors would be approximately 30 versus a beta of approximately 300 for vertical PNP devices.

From the preceding description of the preferred embodiments, it is evident that the objects of the invention are attained in that a process of fabricating an IC having unisolated IGFETs and isolated bipolar devices is described. Although the invention has been described and illustrated in detail, it is to be clearly understood that the same is by way of illustration and example only and is not to be taken by way of limitation. The process may be varied wherein the P+ surface regions may be formed before the N+ surface regions. Similarly, the materials and dopants are merely examples of types of materials and dopants which may be used. The resulting impurity concentrations are selected for particular characteristics of the devices. As shown above, the buried N+ region 18 may be deleted depending upon the type of device to be formed in the isolated region 21 of the epitaxial layer. The spirit and scope of this invention are to be limited only by the terms of the appended claims.

What is claimed:

1. A process of fabricating an integrated circuit including complementary insulated gate field effect transistors and a junction isolated bipolar device comprising:
- diffusing first P type impurities into an N conducting type substrate to form a first P type region;
- epitaxially forming an N type layer on said substrate;
- implanting second P type impurities in the surface of said epitaxial layer to form a second P type region;
- diffusing said first P type region up and said second P type region down into said epitaxial layer until they overlap to isolate a third N-type region of said epitaxial layer from the remainder of the epitaxial layer;
- diffusing first N type impurities into said second P type region to form source and drain regions of an N channel device and into said third N type region to form a first region of said bipolar device; and
- diffusing third P type impurities into said epitaxial layer to form source and drain regions of a P channel device and into said third N type region to form a second region of said bipolar device.

2. The process according to claim 1 wherein said first P type impurities are introduced into said substrate through a mask; and including introducing second N type impurities into said first region through said mask after diffusion of said first P type impurities.

3. The process according to claim 2 wherein said implanting said second P type impurities includes forming a fourth P type region in the surface of said epitaxial layer which will be said third N type region, said fourth P type region being the base of said bipolar device, said first region of said bipolar device being the emitter and said second region of said bipolar device being the base contact.

4. The process according to claim 2 wherein said first region of said bipolar device forms the contact region of the base of a lateral bipolar device, said third N type region forms the base of said bipolar device, and said third P type diffusion forms laterally spaced collector and emitter regions in said third N type region.

5. A process for fabricating an integrated circuit comprising:
- diffusing P+ type impurities into an N type substrate to form a buried P+ region;
- epitaxially forming an N− type layer on said substrate;
- introducing P− impurities into the surface of said epitaxially layer to form a P− surface region;
- diffusing said P+ and P− regions into said epitaxial layer until they overlap to form an isolated N− region of said epitaxial layer;
- diffusing N+ impurities into said surface P− region to form source and drain regions of an N channel device and into said isolated N− region to form a region of a bipolar device; and
- diffusing P+ type impurities into said epitaxial layer to form source and drain regions of a P channel device and into said isolated N− region to form another region of said bipolar device.

6. The processing according to claim 5 wherein introducing P− impurities also forms a P− region in the surface of said epitaxial layer which will be said isolated N− region spaced from the other P− impurity regions.

7. The process according to claim 5 wherein said first mentioned P+ type impurities are introduced through a mask and including introducing N+ type impurities through said mask after diffusion of said P+ type impurities.

8. A process for fabricating an integrated circuit including complementary insulated gate field effect and bipolar transistors comprising:
- diffusing first P type impurities into an N type substrate to form a buried region;
- diffusing first N type impurities into said P buried region to form an N buried region;
- epitaxially forming an N type layer on said substrate;
- introducing second P type impurities into the surface of said epitaxial layer at the edges of said P buried region to form a first P surface region and above said N buried region to form a second P surface region;
- diffusing said impurities into said N epitaxial layer until said first P surface region overlaps said P buried region to form an isolated N region;
- diffusing second N type impurities into said first P surface region to form source and drain region, into said second P surface region to form an emitter region, and into said isolated N region to form a collector contact region; and
- diffusing third P type impurities into said N epitaxial region to form source and drain regions, into said first P surface region to form an isolation and N channel body contact region, and into said second P surface region to form a base contact region.

9. The process according to claim 8 wherein said first P type impurities to form said P buried region are introduced through a mask and said first N type impurities to form said N buried region are introduced through said mask after diffusion of said first P type impurities.

10. The process according to claim 8 wherein said second P type impurities are introduced to form a base region in said epitaxial layer which is a collector region, said second N type impurities are diffused in said base region to form an emitter region, and said third P type impurities are diffused in said base region to form a base contact.

* * * * *